(12) United States Patent
Yamaguchi

(10) Patent No.: US 8,019,033 B2
(45) Date of Patent: Sep. 13, 2011

(54) DATA TRANSMISSION SYSTEM, CONTROLLER, AND ITS METHOD

(75) Inventor: Hiroshi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 700 days.

(21) Appl. No.: 11/126,190

(22) Filed: May 11, 2005

(65) Prior Publication Data

US 2005/0254612 A1 Nov. 17, 2005

(30) Foreign Application Priority Data

May 12, 2004 (JP) ................................ 2004-141763

(51) Int. Cl.
*H04L 7/04* (2006.01)
(52) U.S. Cl. ........................................ 375/362; 376/354
(58) Field of Classification Search .................. 375/259, 375/219, 220, 257, 354, 356, 362, 371; 327/161; 370/282, 503, 516, 517; 713/400, 401, 600
See application file for complete search history.

(56) References Cited

U.S. PATENT DOCUMENTS

| | | |
|---|---|---|
| 5,621,774 A | 4/1997 | Ishibashi et al. |
| 5,794,020 A | 8/1998 | Tanaka et al. |
| 6,484,268 B2 * | 11/2002 | Tamura et al. ................ 713/600 |
| 7,161,986 B2 * | 1/2007 | Yamaguchi .................... 375/259 |
| 2002/0009169 A1 * | 1/2002 | Watanabe ..................... 375/371 |

FOREIGN PATENT DOCUMENTS

| | | |
|---|---|---|
| EP | 1 318 640 A2 | 6/2003 |
| JP | 4-293332 A | 10/1992 |
| JP | 2003-174484 A | 6/2003 |

* cited by examiner

*Primary Examiner* — Young T. Tse
(74) *Attorney, Agent, or Firm* — Sughrue Mion, PLLC

(57) ABSTRACT

To provide a data transmission system capable of reducing skews between a reference signal and a phase modulation signal and accelerating data transmission.

In a data transmission system having a transmitter for transmitting a reference signal and a phase modulation signal having a phase difference related to the value of input data from the reference signal and a receiver for obtaining data in accordance with the phase difference between the received reference signal and phase modulation signal, the transmitter transmits the reference signal and an adjustment signal having no phase difference before transmitting data and a control circuit variably controls delay values of variable delay devices so that the phase difference between the reference signal and adjustment signal received by the receiver decreases.

23 Claims, 11 Drawing Sheets

DATA TRANSMISSION SYSTEM, CONTROLLER, AND ITS METHOD

BACKGROUND OF THE INVENTION

1. Field of the Invention

The present invention relates to a data transmission system, a controller, and its method, particularly to a data transmission system having a transmitter for transmitting a reference signal and a phase modulation signal having the phase difference related to the value of input data from the reference signal and a receiver for obtaining the data in accordance with the phase difference between the reference signal and the phase modulation signal which are received.

2. Related Art

Figure 7:
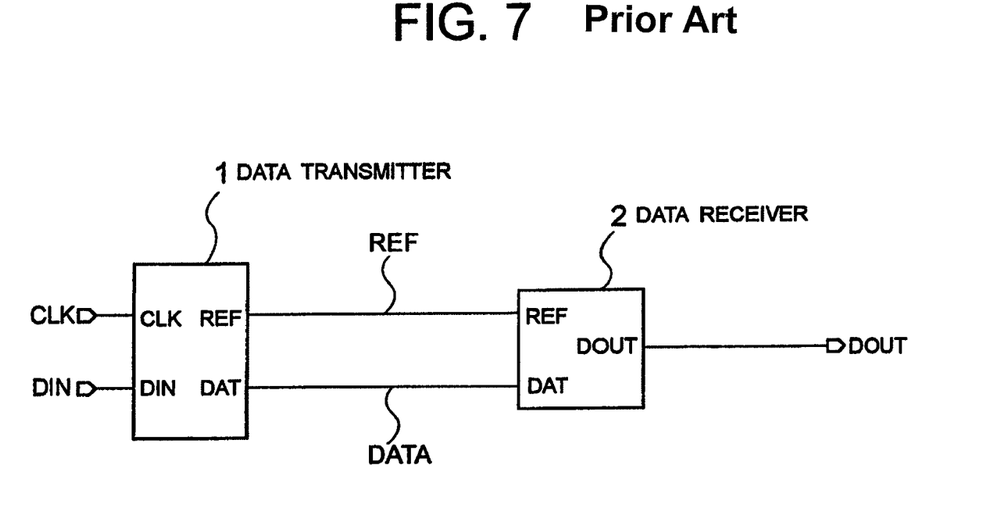
FIG. 7 is an illustration showing a configuration of a conventional data transmission system.
Figure 8:
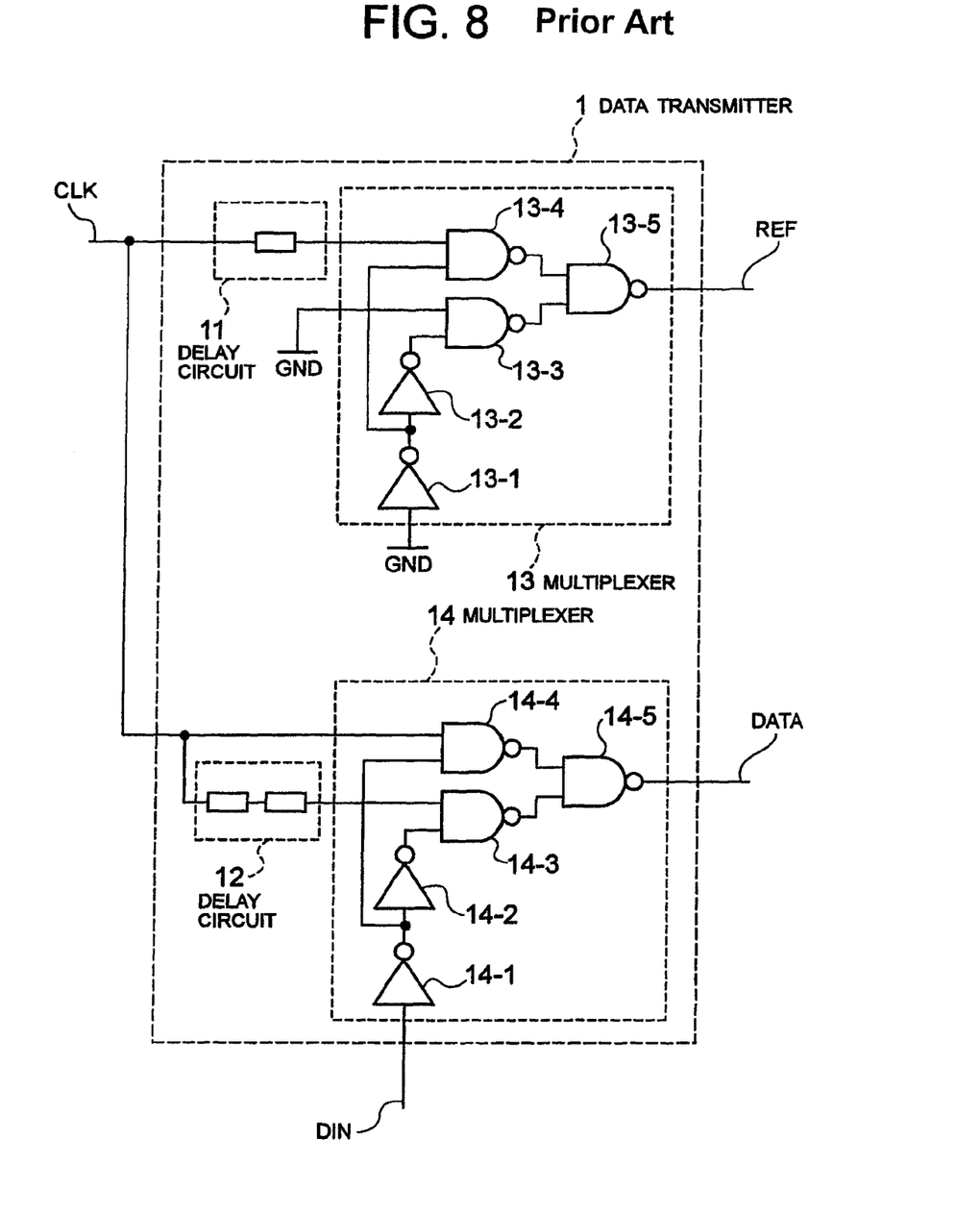
FIG. 8 is an illustration showing a configuration of the data transmitter in FIG. 7.

FIG. 7 is an illustration showing a configuration of a data transmission system disclosed in Japanese Patent Laid-Open No. 2003-174484, which has a data transmitter 1 and a data receiver 2. FIG. 8 is an illustration showing a configuration of the data transmitter 1 in FIG. 7. As shown in FIG. 8, the data transmitter 1 has delay circuits 11 and 12 and multiplexers 13 and 14. The multiplexer 13 has inverters 13-1 and 13-2 and NAND circuits 13-3 to 13-5 and the multiplexer 14 has inverters 14-1 and 14-2 and NAND circuits 14-3 to 14-5.

The delay circuit 11 is constituted so as to output a signal CLK having a base frequency from the outside by delaying the signal CLK by one unit time. The delay circuit 12 has a delay time two times larger than that of the delay circuit 11 and is constituted so as to output the signal CLK by delaying it by two unit times.

The multiplexer 13 always selects an output of the delay circuit 11 and outputs the output as a reference signal REF. Moreover, the multiplexer 13 is used to absorb the time required for the processing of the multiplexer 14 and synchronize with an output of the multiplexer 14. Therefore, when the processing of the multiplexer 14 is very fast and the processing time can be ignored, it is possible to directly output an output of the delay circuit 11 as the reference signal REF without using the multiplexer 13.

Figure 10A:
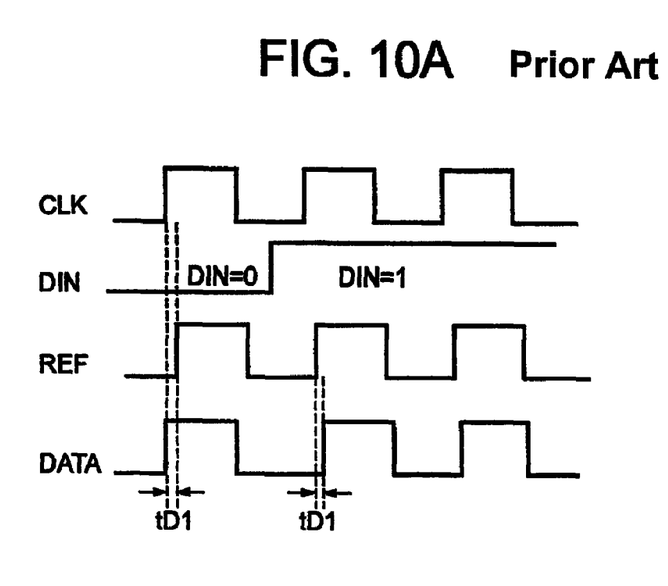
FIG. 10A is a timing chart showing operations of the data transmitter in FIG. 7

The multiplexer 14 selects the signal CLK or a signal sent from the delay circuit 12 in accordance with input data DIN and outputs it as transmission data (phase modulation signal) DATA. Specifically, the multiplexer 14 inputs the signal CLK and a signal (signal whose phase is delayed by two unit times from the signal CLK) sent from the delay circuit 12. Then, as shown in FIG. 10A, when the data DIN is "0", the multiplexer 14 selects the signal CLK and outputs the signal CLK as transmission data DATA. When the data DIN is "1", the multiplexer 14 selects a signal sent from the delay circuit 12 and outputs the signal as transmission data DATA. That is, the phase of the transmission data DATA output from the multiplexer 14 advances by one unit time tD1 from the phase of the reference signal REF output from the multiplexer 13 when the data DIN is equal to "0" and is output by being delayed by one unit time tD1 from the phase of the reference signal REF when the data DIN is equal to "1". FIG. 10A is a timing chart showing operations of the data transmitter 1 in FIG. 7.

According to the above configuration, the reference signal REF and transmission data DATA are output from the data transmitter 1.

Figure 9:
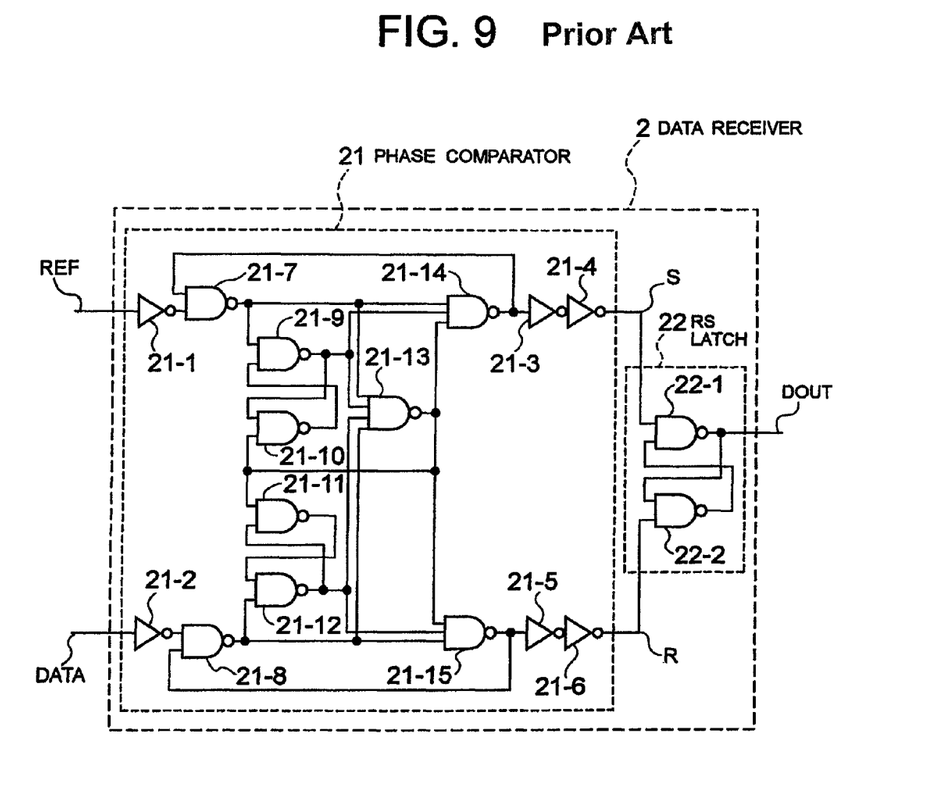
FIG. 9 is an illustration showing a configuration of the data receiver in FIG. 7.

FIG. 9 is an illustration showing a configuration of the data receiver 2 in FIG. 7. As shown in FIG. 9, the data receiver 2 to which the reference signal REF and transmission data DATA are input has a phase comparator 21 and RS latch 22. The phase comparator 21 has inverters 21-1 to 21-6 and NAND circuits 21-7 to 21-15 and the RS latch 22 has NAND circuits 22-1 and 22-2.

The phase comparator 21 is constituted so as to input the reference signal REF and transmission data DATA and detect the phase difference between the reference signal REF and the transmission data DATA. Moreover, when the phase of the transmission data DATA advances from the phase of the reference signal REF, a phase advance detection signal R is output by having a pulse width equivalent to the phase difference. However, when the phase of the transmission data DATA delays from the phase of the reference signal REF, a phase delay detection signal S is output by having a pulse width equivalent to the phase difference.

That is, when the phase of the transmission data DATA advances from the phase of the reference signal REF by one unit time, the phase advance detection signal R is output by having a pulse width equivalent to one unit time. However, when the phase of the transmission data DATA delays from the phase of the reference signal REF by one unit time, the phase delay detection signal S is output by having a pulse width equivalent to one unit time.

Figure 10B:
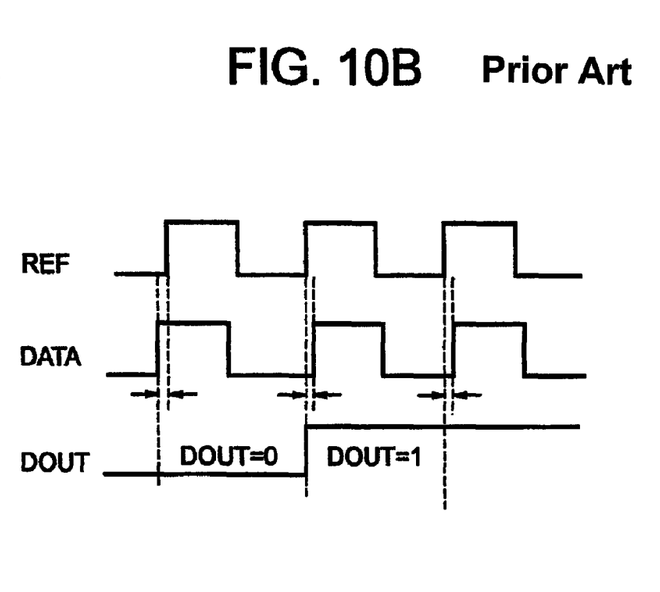
FIG. 10B is a timing chart showing operations of the data receiver in FIG. 7.

The RS latch 22 receives the phase delay detection signal S and the phase advance detection signal R. As shown in FIG. 10B, the RS latch 22 obtains a demodulation output DOUT so that the demodulation output DOUT is set to "0" when the phase advance detection signal R is applied to the reset input of the RS latch 22, that is, when the phase of the transmission data DATA advances from the phase of the reference signal REF, and the demodulation output DOUT is set to "1" when the phase delay detection signal S is applied to the set input of the RS latch 22, that is, when the phase of the transmission data DATA delays from the phase of the reference signal REF. FIG. 10B is a timing chart showing operations of the data receiver 2 in FIG. 7.

Figures 11A, 11B, 11C:
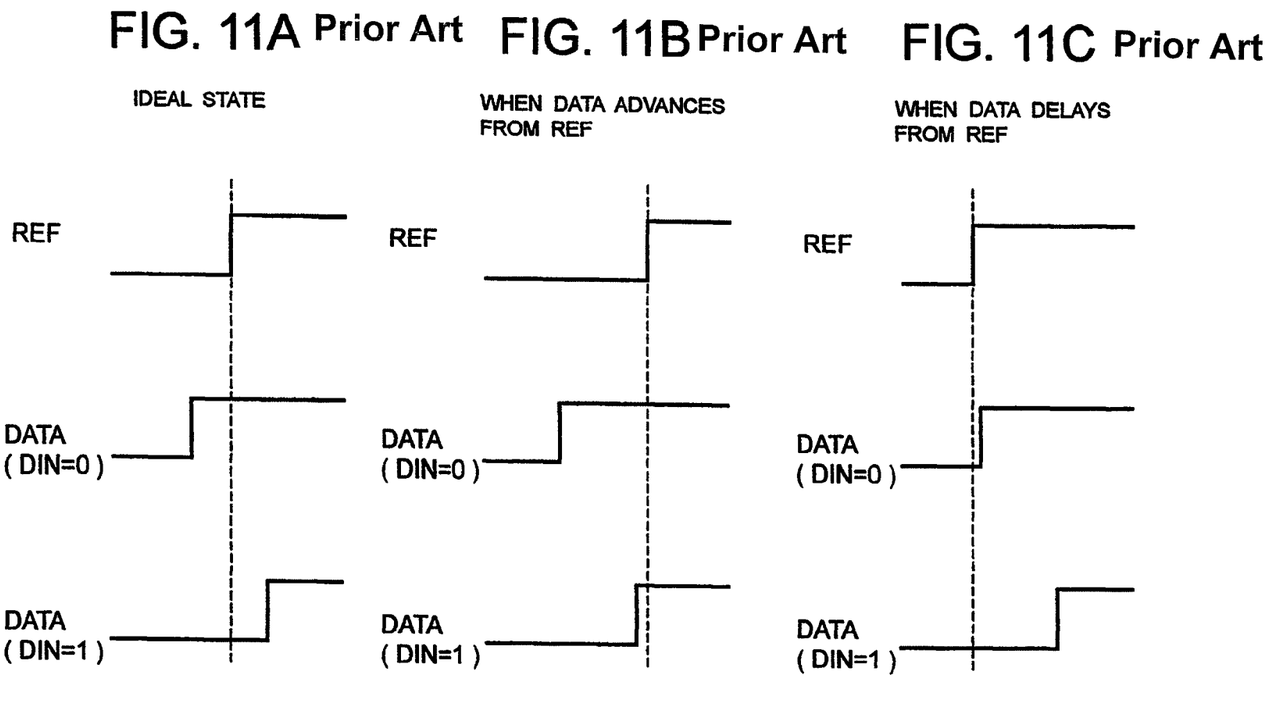
FIGS. 11A to 11C are illustrations for explaining problems of the data transmission system in FIG. 7.

In the case of the above data transmission system, as shown in FIG. 1A, it is necessary that the phase of the phase modulation signal DATA advances or delays from the reference signal REF in accordance with the value of the input data DIN.

However, when a skew between a reference signal and a phase modulation signal occurs due to the delay fluctuation of LSIs or transmission lines and the phase modulation signal DATA always advances independently of the value of the input data DIN from the reference signal REF as shown in FIG. 11B or the phase modulation signal DATA always delays independently of the value of the input data DIN from the reference signal REF as shown in FIG. 1C, there is a problem that the receiver malfunctions.

BRIEF SUMMARY OF THE INVENTION

It is an object of the present invention to provide a data transmission system capable of reducing skews between a reference signal and a phase modulation signal and accelerating data transmission, controller, and its method.

A data transmission system of the present invention is a data transmission system having a transmitter for transmitting a reference signal and a phase modulation signal having a phase difference related to the value of input data from the reference signal and a receiver for obtaining the data in accordance with the phase difference between the received reference signal and phase modulation signal and including variable delay means delaying at least one of the reference signal and the phase modulation signal to be transmitted to the receiver from the transmitter through a transmission line and control means variably controlling the delay value of the variable delay means, in which the transmitter transmits the reference signal and an adjustment signal having a predetermined phase relation with the reference signal through the transmission line before transmitting the data and the control means variably controls the delay value of the variable delay means so as to bring the phase relation between the reference signal and the adjustment signal to be received by the receiver into the predetermined phase relation.

An operation control method of the present invention is an operation control method of a data transmission system having a transmitter for transmitting a reference signal and a phase modulation signal having a phase difference related to the value of input data from the reference signal and a receiver for obtaining the data in accordance with the phase difference between the reference signal and the phase modulation signal, including a step of transmitting, before transmitting the data, the reference signal and an adjustment signal having a predetermined phase relation with the reference signal from the transmitter to the receiver through a transmission line through which the reference signal and the phase modulation signal are transmitted and a control step of variably controlling the delay value of the variable delay means for delaying at least one of the reference signal and the phase modulation signal transmitted from the transmitter through the transmission line so as to bring the phase relation between the reference signal and the adjustment signal received by the receiver into the predetermined phase relation.

A controller of the present invention is a controller of a data transmission system having a transmitter for transmitting a reference signal and a phase modulation signal having a phase difference related to the value of input data from the reference signal, a receiver for obtaining the data in accordance with the phase difference between the reference signal and the phase modulation signal which are received, and variable delay means for delaying at least one of the reference signal and the phase modulation signal transmitted from the transmitter to the receiver through a transmission line and including control means for variably controlling the delay value of the variable delay means so as to bring the phase relation between the reference signal and an adjustment signal having a predetermined phase relation with the reference signal, the reference signal and the adjustment signal transmitted from the transmitter through the transmission line before transmitting the data and received by the receiver into the predetermined phase relation.

A control method of the present invention is a control method of a controller of a data transmission system having a transmitter for transmitting a reference signal and a phase modulation signal having a phase difference related to the value of input data from the reference signal, a receiver for obtaining the data in accordance with the phase difference between the reference signal and the phase modulation signal which are received, and variable delay means for delaying at least one of the reference signal and the phase modulation signal transmitted to the receiver from the transmitter through a transmission line and including a step of variably controlling the delay value of the variable delay means so as to bring the phase relation between the reference signal and an adjustment signal having a predetermined phase relation with the reference signal, the reference signal and the adjustment signal transmitted from the transmitter through the transmission line before transmitting the data and received by the receiver into the predetermined phase relation.

Thus, the present invention uses a data transmission system having a transmitter for transmitting a reference signal and a phase modulation signal having a phase difference related to the value of input data from the reference signal and a receiver for obtaining data in accordance with the phase difference between the received reference signal and phase modulation signal, in which the transmitter transmits the reference signal and an adjustment signal having no phase difference with the reference signal during an adjustment period before transmitting the data. Moreover, the receiver detects the phase difference between the received reference signal and adjustment signal and a controller variably controls the delay value of delay means set to a transmission line between the transmitter and the receiver so that the phase difference decreases.

DETAILED DESCRIPTION OF THE PREFERRED EMBODIMENTS

Embodiments of the present invention are described below by referring to the accompanying drawings.

Figure 1:
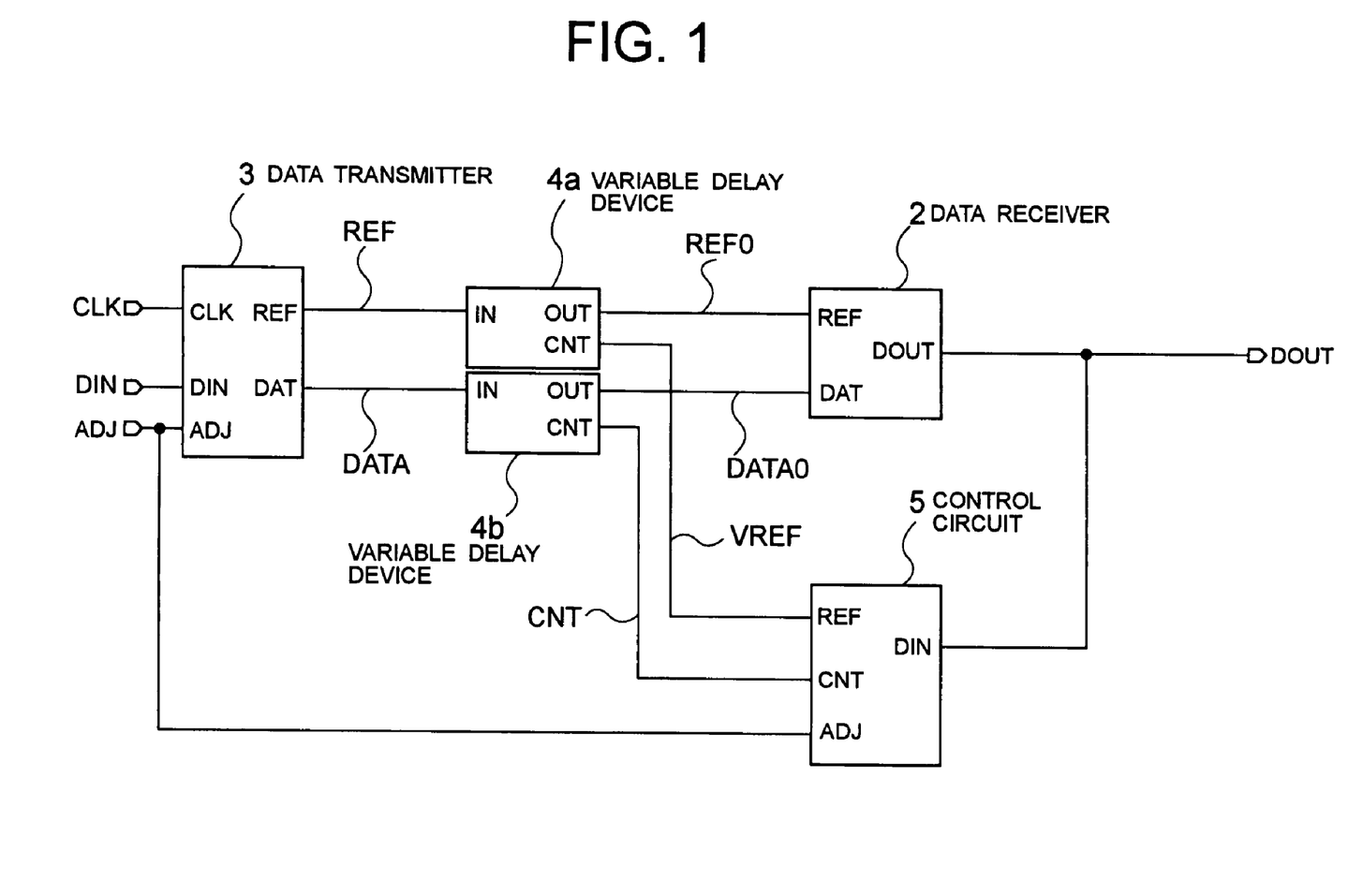
FIG. 1 is an illustration showing a configuration of a data transmission system according to an embodiment of the present invention.

FIG. 1 is an illustration showing a configuration of a data transmission system according to an embodiment of the present invention and a portion same as that in FIG. 7 is provided with the same symbol. The data transmission system according to the embodiment of the present invention has a data transmitter 3, variable delay devices 4a and 4b, a data receiver 2, and a control circuit 5. A configuration of the data receiver 2 is the same as the configuration shown in FIG. 9.

The data transmitter 3 transmits a reference signal and an adjustment signal having a predetermined phase relation for the reference signal during an adjustment period for adjusting a phase before data transmission and transmits the reference signal and a phase modulation signal having a phase difference related to the value of input data from the reference signal during a data transmission period after the adjustment period.

The variable delay devices 4a and 4b are delay means for respectively delaying a reference signal REF and phase modulation signal (or adjustment signal) DATA sent from the data transmitter 3. It is preferable to use the variable delay devices 4a and 4b having the same characteristics. This is because the characteristics are changed in the same direction even if the characteristics are changed due to a temperature change or the like.

As shown in FIG. 9, the data receiver 2 has a phase comparator 21 and an RS latch 22. The phase comparator 21 detects the phase difference between a reference signal REF0 and a phase modulation signal (or adjustment signal) DATA0 delayed by the variable delay devices 4a and 4b. The RS latch 22 outputs data DOUT having a value related to the detected phase difference. However, in the case of the adjustment period, symbol DATA shows an adjustment signal having a predetermined phase relation for a reference signal REF, symbol DATA0 shows an adjustment signal delayed by the variable delay device 4b. In the case of the data transmission period, the symbol DATA shows a phase modulation signal having a phase difference related to the value of input data DIN from the reference signal REF and the symbol DATA0 shows a phase modulation signal delayed by the variable delay device 4b.

The control circuit 5 controls delay values of the variable delay devices 4a and 4b during the adjustment period so as to bring the phase relation between the reference signal REF0 and adjustment signal DATA0 received by the receiver 2 into the above predetermined phase relation and keeps delay values of the variable delay devices 4a and 4b controlled in the adjustment period during the data transmission period.

Figure 2:
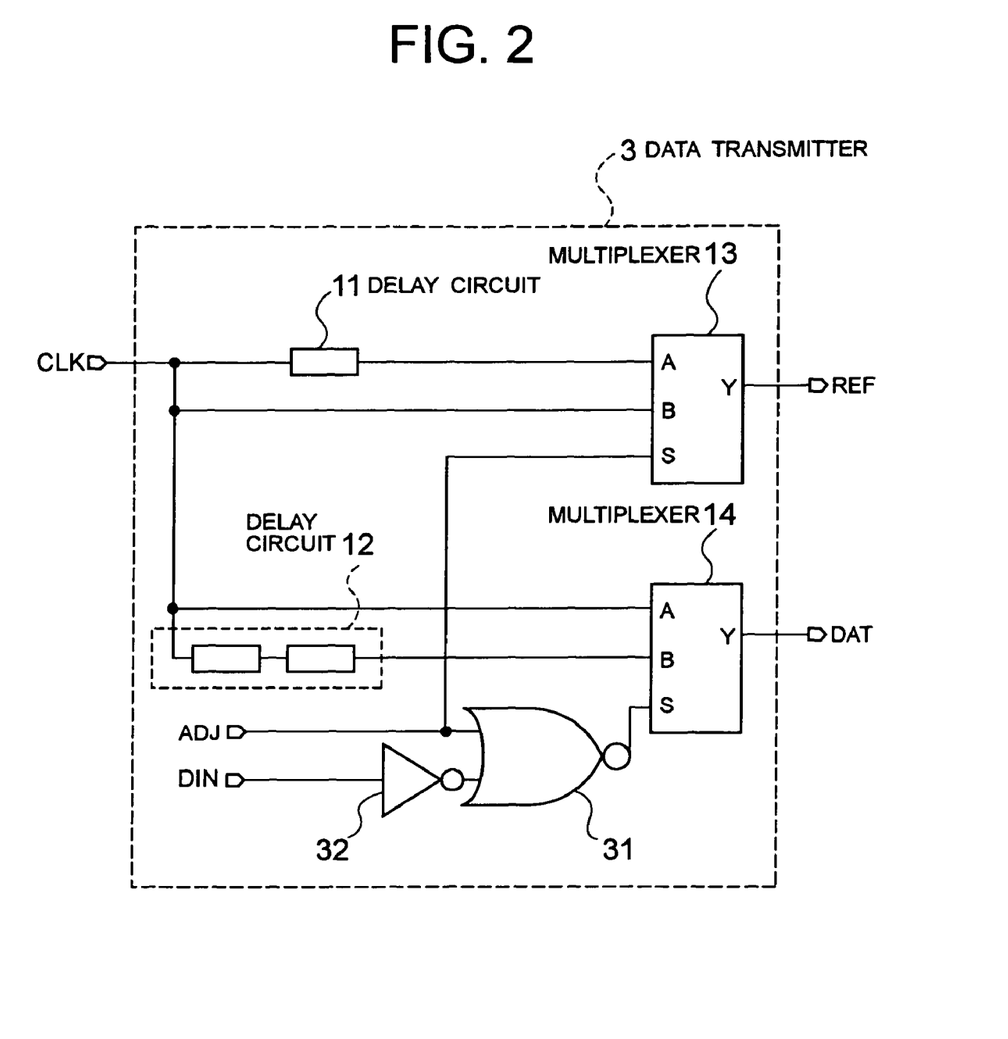
FIG. 2 is an illustration showing a configuration of the data transmitter in FIG. 1.

FIG. 2 is an illustration showing a configuration of the data transmitter 3 in FIG. 1, in which a portion same as that in FIG. 8 is provided with the same symbol. As shown in FIG. 2, the data transmitter 3 has delay circuits 11 and 12, multiplexers 13 and 14, a NOR circuit 31, and an inverter 32.

In the data transmission period, because an adjustment designation signal ADJ is set to "0", the data transmitter 3 outputs a phase modulation signal DATA whose one-unit-time phase advances from the phase of the reference signal REF when data DIN is set to "0" and outputs a phase modulation signal DATA whose one-unit-time phase delays from the phase of the reference signal REF when data DIN is set to "1" similarly to the case of the transmitter 1 in FIG. 8. Because the adjustment designation signal ADJ is set to "1" in the adjustment period, the data transmitter 3 outputs an adjustment signal DATA having no phase difference with the reference signal REF.

In this adjustment period, the phase difference between the reference signal REF0 and adjustment signal DATA0 received by the data receiver 2 through the variable delay devices 4a and 4b is detected and the variable delay devices 4a and 4b are adjusted by the control circuit 5 so as to decrease the phase difference.

Figure 3A:
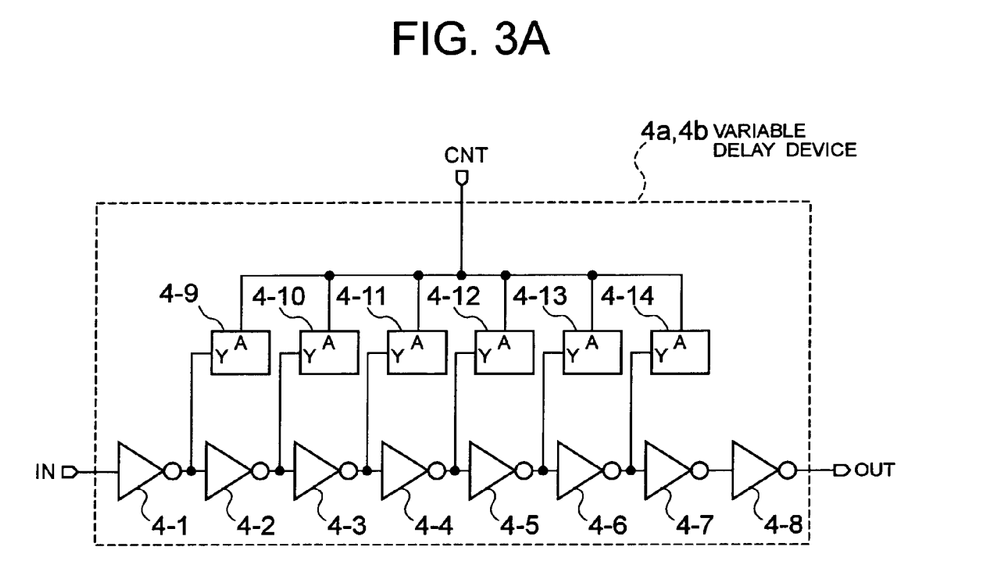
FIG. 3A is an illustration showing a configuration of the variable delay device in FIG. 1
Figure 3B:
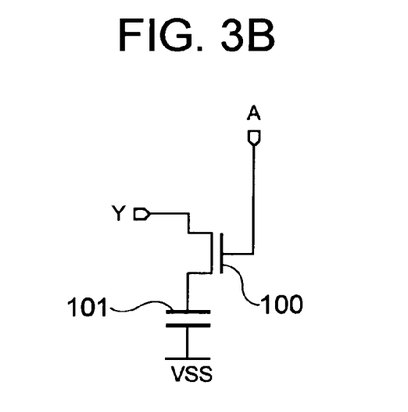
FIG. 3B is an illustration showing a configuration of a load.

FIG. 3A is an illustration showing a configuration of each of the variable delay devices 4a and 4b in FIG. 1 and FIG. 3B is an illustration showing a configuration of the load in FIG. 3A. As shown in FIG. 3A, the variable delay devices 4a and 4b respectively have inverters 4-1 to 4-8 and loads 4-9 to 4-14. As shown in FIG. 3B, each of the loads 4-9 to 4-14 is constituted of an nMOS transistor 100 and capacity 101. When a control terminal A is set to "0", the nMOS transistor 100 is turned off and a delay decreases because the capacity 101 is not seen as the load of an inverter.

However, when the control terminal A is set to "1", the nMOS transistor 100 is turned on and the delay increases because the capacity 101 is seen as the load of the inverter. Actually, a logical value "0" corresponds to a GND and a logical value "1" corresponds to a power supply voltage VDD. It is possible to continuously change a delay value by change a voltage value to be applied to the control terminal A. Therefore, it is possible to change a delay value during IN-OUT by a control terminal CNT.

Figure 4:
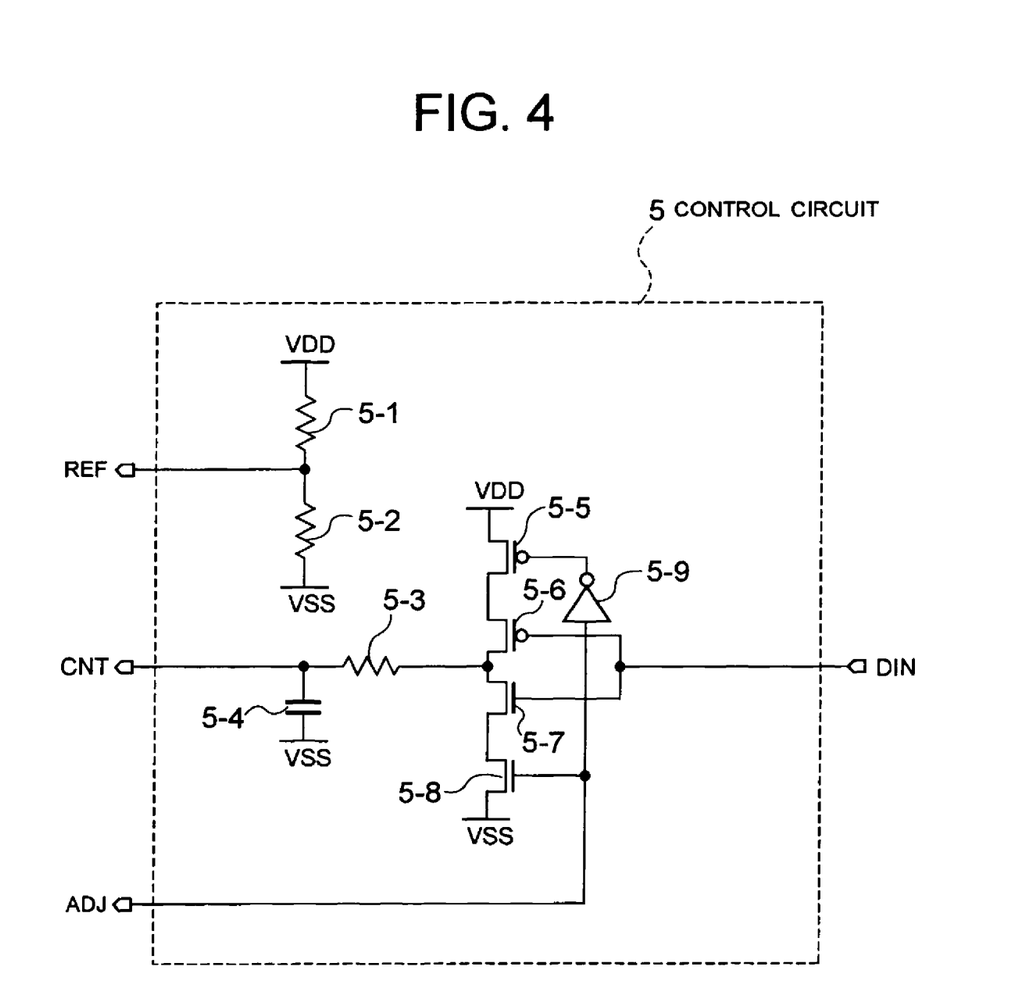
FIG. 4 is an illustration showing a configuration of the control circuit in FIG. 1.

FIG. 4 is an illustration showing a configuration of the control circuit 5 in FIG. 1. As shown in FIG. 4, the control circuit 5 has resistances 5-1 to 5-3, a capacity 5-4, transistors 5-5 to 5-8, and an inverter 5-9. A predetermined voltage is generated as an output VREF of the control circuit 5 through resistance division and input to the control terminal CNT of the variable delay device 4a to make the delay value of the variable delay device 4a predetermined.

The input DIN of the control circuit 5 is connected to the output DOUT of the data receiver 2. In the adjustment period, the adjustment designation signal ADJ is set to "1". When the phase of the adjustment signal DATA0 advances from the reference signal REF0, the input DIN of the control circuit 5 is set to "0", the capacity 5-4 is charged, and the potential of the output CNT of the control circuit 5 rises. Therefore, the delay value of the variable delay device 4b increases and the phase difference between the reference signal REF0 and the adjustment signal DATA0 decreases. When the phase of the adjustment signal DATA0 delays from the reference signal REF0, the input DIN of the control circuit 5 is set to "1", the capacity 5-4 is discharged, and the potential of the output CNT of the control circuit 5 lowers. Therefore, the delay value of the variable delay device 4b decreases and the phase difference between the reference signal REF0 and the adjustment signal DATA0 decreases.

It is possible to decrease the phase difference between the reference signal REF0 and the adjustment signal DATA0 to zero by the above operations of the control circuit 5. When the adjustment designation signal ADJ is set to "0" in the data transmission period, a route for charging and discharging the capacity 5-4 disappears. Therefore, the potential of the output CNT of the control circuit 5 is held by the capacity 5-4. That is, in the data transmission period, the delay value of the variable delay device 4b is kept at a value controlled in the adjustment period.

It is possible to properly change the number of stages of the loads and inverters of the variable delay devices 4a and 4b and the resistance and capacity of the control circuit 5 in accordance with a delay adjustment value or phase comparison accuracy.

Operations of the data transmission system of the embodiment of the present invention are described by referring to the accompanying drawings.

Figure 5A:
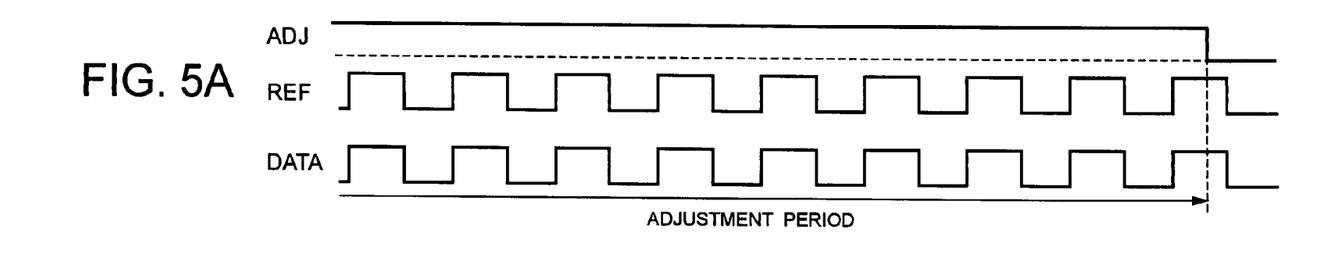
FIG. 5A is a timing chart showing operations of the data transmitter in FIG. 1 in the adjustment period and FIG. 5B is a timing chart showing operations of the data receiver and control circuit in FIG. 1 in the adjustment period.
Figure 5B:
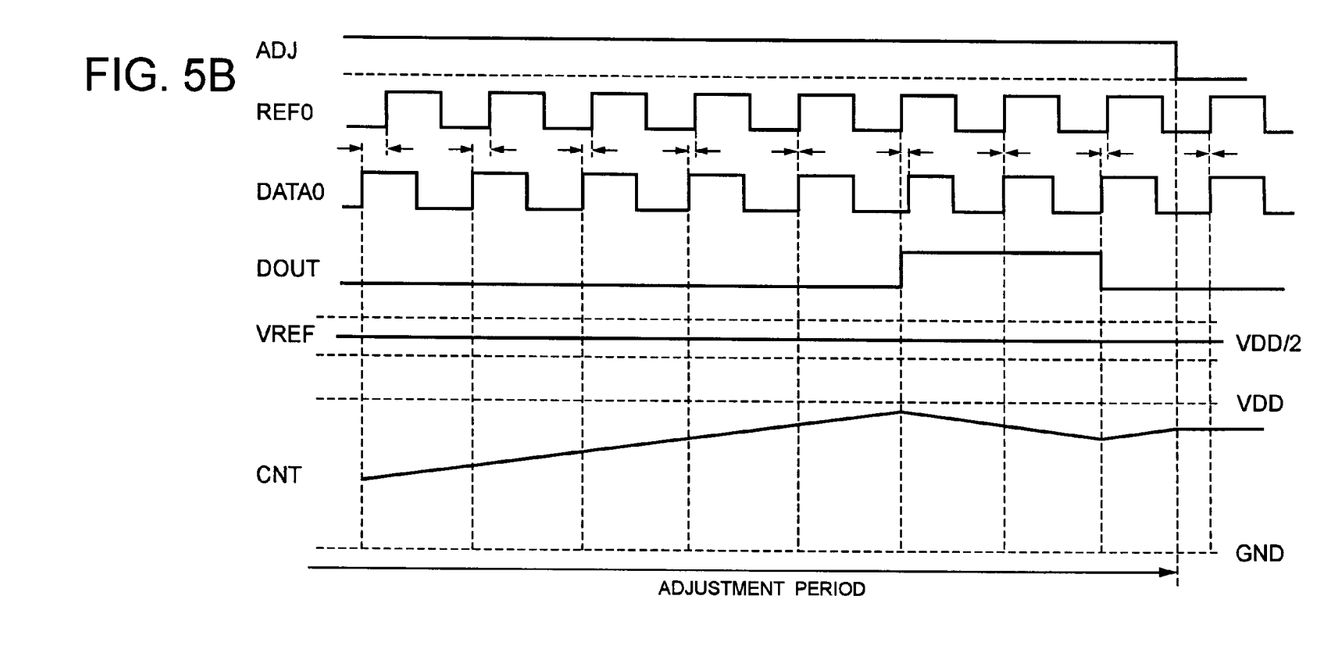

Operations in the adjustment period for adjusting a case in which the reference signal REF and phase modulation signal DATA are displaced as shown in FIGS. 11B and 11C so as to become the ideal state in FIG. 11A are described by referring to FIGS. 5A and 5B. FIG. 5A is a timing chart showing operations of the data transmitter 3 in the adjustment period and FIG. 5B is a timing chart showing operations of the data receiver 2 and control circuit 5 in the adjustment period.

As shown in FIG. 5A, because the adjustment designation signal ADJ is set to "1", the reference signal REF and adjustment signal DATA having no phase difference are generated. This is realized by inputting a signal CLK having a base frequency to the multiplexers 13 and 14 not through the delay circuits as shown in FIG. 2. The reference signal REF and the adjustment signal DATA having no phase difference may be displaced as shown in FIGS. 11B and 11C due to the fluctuation of actual transmission lines or circuits.

As shown in FIG. 5B, when the reference signal REF0 and adjustment signal DATA0 input to the data receiver 2 are displaced, the displacement is detected by the phase comparator 21 as the phase difference between the reference signal REF0 and the adjustment signal DATA0 and the output DOUT corresponding to a comparison result by the phase comparator 21 is output from the RS latch 22. Then, the control circuit 5 adjusts the variable delay devices 4a and 4b provided to the transmission lines between the data transmitter 3 and the data receiver 2 in accordance with the output DOUT of the data receiver 2 so that the phase difference decreases. In FIG. 5B, initial values of the outputs VREF and CNT of the control circuit 5 are set to VDD/2.

Figure 6A:
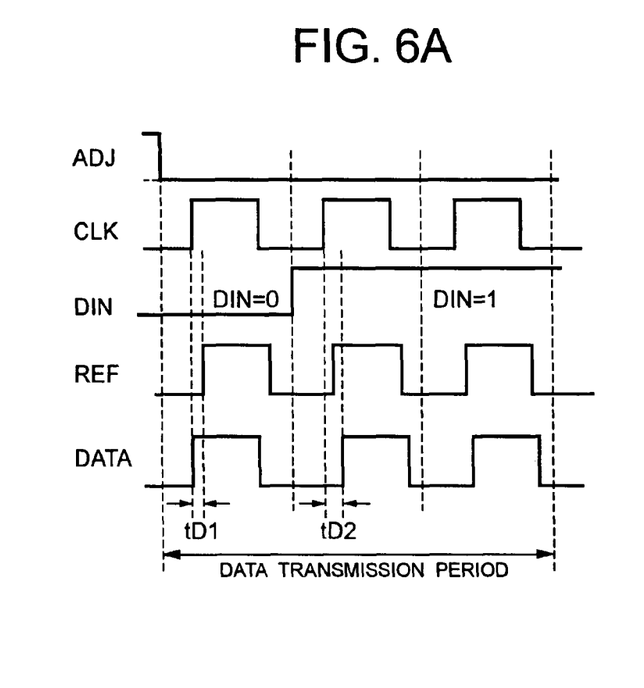
FIG. 6A is a timing chart showing operations of the data transmitter in FIG. 1 in the data transmission period and FIG. 6B is a timing chart showing operations of the data receiver and control circuit in FIG. 1 in the data transmission period.
Figure 6B:
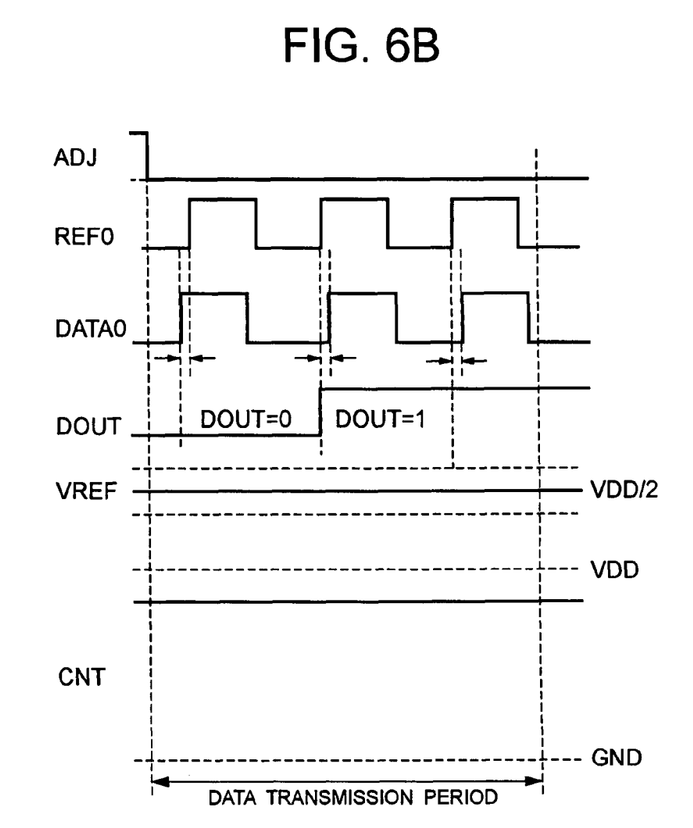

Then, operations in the data transmission period are described below by referring to FIGS. 6A and 6B. FIG. 6A is a timing chart showing operations of the data transmitter 3 in the data transmission period and FIG. 6B is a timing chart showing operations of the data receiver 2 and control circuit 5 in the data transmission period.

In the data transmission period, the adjustment designation signal ADJ which is set to "0" is input to the data transmitter 3 and control circuit 5. As shown in FIG. 6A, the data transmitter 3 receives the signal CLK having the base frequency, delays the signal CLK by one unit time tD1 by the delay circuit 11, and outputs the signal CLK as the reference signal REF through the multiplexer 13. Moreover, the signal CLK is input to the multiplexer 14 and the delay circuit 12 and the signal delayed by two unit times tD2 is also input to the multiplexer 14.

When the input data DIN is set to "0", the multiplexer 14 selects the signal CLK (signal not delayed) and outputs it as the phase modulation signal DATA. However, when the data DIN is set to "1", the signal CLK delayed through the delay circuit 12 by two unit times tD2 is selected and output as the phase modulation signal DATA. Therefore, when the data DIN is set to "0", the phase modulation signal DATA whose phase advances by one unit time tD1 from the reference signal REF is transmitted and when the data DIN is set to "1", the phase modulation signal DATA whose phase is delayed by one unit time tD1 from the reference signal REF is transmitted.

The data receiver 2 receives the reference signal REF0 and phase modulation signal DATA0 incoming through the variable delay devices 4a and 4b and their phases are compared by the phase comparator 21. As shown in FIG. 6B, because the control circuit keeps its outputs VREF and CNT at voltage values adjusted in the adjustment period, the phase relation between the reference signal REF0 and the phase modulation signal DATA0 received by the data receiver 2 keeps the phase relation between the reference signal REF and the phase modulation signal DATA.

The phase comparator 21 detects the phase difference between the reference signal REF0 and the phase modulation signal DATA0 When the phase of the phase modulation signal DATA0 advances from the phase of the reference signal REF0, the phase comparator 21 outputs the phase advance detection signal R having the pulse width equivalent to the phase difference between the reference signal REF0 and the phase modulation signal DATA0. Moreover, when the phase of the phase modulation signal DATA0 delays from the phase of the reference signal REF0, the phase comparator 21 outputs the phase delay detection signal S having the pulse width equivalent to the phase difference between the phase modulation signal DATA0 and the reference signal REF0.

When the phase delay detection signal S is applied to a set input terminal, the RS latch 22 sets the output DOUT to "1" but when the phase advance detection signal R is applied to a reset input terminal, it sets the output DOUT to "0". Then, it is possible to obtain transmitted data from the level of the demodulation output DOUT.

As described above, in the case of the embodiment of the present invention, by decreasing skews between the reference signal and the phase modulation signal due to the delay fluctuation of LSIs or transmission lines and equalizing the phase relation between the reference signal and the phase modulation signal received by the receiver with the phase relation for transmission, it is possible to enlarge the margin to jitter or noise. Therefore, it is possible to prevent malfunctions and accelerate data transmission.

The control circuit 5 can be included in the data receiver 2.

What is claimed is:

1. A data transmission system comprising:
   a transmitter for transmitting a reference signal and a phase modulation signal during a data transmission period, the phase modulation signal having a phase difference with respect to the reference signal related to a value of input data, and for transmitting an adjustment signal having a predetermined phase relation with respect to the reference signal during an adjustment period before transmitting data;
   a receiver for outputting an output data in accordance with the phase difference between the reference signal and the phase modulation signal;
   variable delay means, coupled between the transmitter and the receiver, for delaying at least one of the reference signal, the phase modulation signal, and the adjustment signal transmitted from the transmitter; and
   control means for variably controlling a delay value of the variable delay means, so as to bring a phase relation between the reference signal received at the receiver from the transmitter and the adjustment signal received at the receiver from the transmitter into the predetermined phase relation,
   wherein the variable delay means comprise a first variable delay circuit provided to a first transmission line through which the reference signal is transmitted from the transmitter and a second variable delay circuit provided to a second transmission line through which the phase modulation signal is transmitted from the transmitter.

2. The data transmission system according to claim 1, wherein
   the control means receives the output data, obtained in accordance with the phase difference between the reference signal and the adjustment signal as received by the receiver, and controls the delay value in accordance with the received output data.

3. The data transmission system according to claim 1, wherein the control means is disposed in the receiver.

4. The data transmission system according to claim 1, wherein the control means controls a first delay value and a second delay value of the first and the second variable delay circuits, respectively, before the data is transmitted, and maintains the first and the second delay values of the first and the second variable delay circuits, respectively, when the data is transmitted.

5. The data transmission system according to claim 1, wherein the control means variably controls a first delay value and a second delay value of the first and the second variable delay circuits, respectively, to decrease a phase difference between the reference signal and the adjustment signal.

6. An operation control method of a data transmission system, the transmission system comprising a transmitter, a receiver, and variable delay circuitries, the method comprising:
   transmitting, from the transmitter to the receiver, a reference signal and a phase modulation signal during a data transmission period, and an adjustment signal having a predetermined phase relation with respect to the reference signal during an adjustment period before transmitting data;

receiving the reference signal and the adjustment signal at the receiver; and setting a delay value of the variable delay circuitries, coupled between the transmitter and the receiver, thus bringing a phase relation between the reference signal and the adjustment signal, as received at the receiver, into the predetermined phase relation, wherein the variable delay circuitries comprise a first variable delay circuit provided to a first transmission line through which the reference signal is transmitted from the transmitter and a second variable delay circuit provided to a second transmission line through which the phase modulation signal is transmitted from the transmitter.

7. The operation control method according to claim 6, further comprising:

transmitting, from the receiver to a controller, an output data from the phase difference between the received reference signal and the received adjustment signal;

wherein setting the delay value comprises setting the delay value by the controller in accordance with the value of the output data.

8. The operation control method according to claim 6, wherein setting the delay value comprises setting a delay value of one of the first and second delay circuits to a predetermined value and variably controlling a delay value of the other of the first and second delay circuits.

9. The operation control method according to claim 6, further comprising:

maintaining the delay value of the variable delay circuitries during transmission of the reference signal and the phase modulation signal from the transmitter to the receiver.

10. The operation control method according to claim 6, further comprising:

variably controlling a first delay value and a second delay value of the first and the second variable delay circuits, respectively, to decrease a phase difference between the reference signal and the adjustment signal.

11. A controller of a data transmission system, the transmission system comprising a transmitter which transmits a reference signal and an adjustment signal having a predetermined phase relation with respect to the reference signal during an adjustment period before transmitting data, a receiver which receives the reference signal and the adjustment signal, and variable, delay circuitries, coupled between the transmitter and the receiver, the controller comprising:

means for transmitting, from the transmitter to the receiver, a reference signal and a phase modulation signal during a data transmission period, and an adjustment signal having a predetermined phase relation with respect to the reference signal during an adjustment period before transmitting data; and control means for setting a delay value of the variable delay circuitries, thus bringing a phase relation between the reference signal and the adjustment signal, as received by the receiver into the predetermined phase relation, based on an output data outputted from the receiver, wherein the variable delay circuitries comprise a first variable delay circuit provided to a first transmission line through which the reference signal is transmitted from the transmitter and a second variable delay circuit provided to a second transmission line through which the phase modulation signal is transmitted from the transmitter.

12. The controller according to claim 11, wherein the data transmitted from the transmitter is received by the receiver in accordance with the phase difference between the reference signal and the adjustment signal.

13. The controller according to claim 11, wherein the control means sets a first delay value of one of the first and second delay circuits to a predetermined value and variably controls a second delay value of the other of the first and second delay circuits.

14. The controller according to claim 11, wherein the control means sets the delay value of the variable delay circuitries before the data is transmitted from the transmitter.

15. The controller according to claim 11, wherein the control means variably controls a first delay value and a second delay value of the first and the second variable delay circuits, respectively, to decrease a phase difference between the reference signal and the adjustment signal.

16. The controller according to claim 11, wherein the control means maintains the delay value when the data is transmitted from the transmitter.

17. A control method of a controller of a data transmission system, the system comprising a transmitter transmitting a reference signal and an adjustment signal having a predetermined phase relation with respect to the reference signal during an adjustment period before transmitting data, a receiver receiving the reference signal and the adjustment signal, and variable delay circuitries, coupled between the transmitter and the receiver, the method comprising:

transmitting, from the transmitter to the receiver, a reference signal and a phase modulation signal during a data transmission period, and an adjustment signal having a predetermined phase relation with respect to the reference signal during an adjustment period before transmitting data;

determining, by the receiver, a phase relation between the reference signal and the adjustment signal; and setting, by the variable delay circuitries, a delay value, thus bringing the phase relation between the reference signal and the adjustment signal into the predetermined phase relation, wherein the variable delay circuitries comprise a first variable delay circuit provided to a first transmission line through which the reference signal is transmitted from the transmitter and a second variable delay circuit provided to a second transmission line through which the phase modulation signal is transmitted from the transmitter.

18. The control method according to claim 17, further comprising:

determining the phase difference between the reference signal and the adjustment signal based on a value of data received from the receiver.

19. The control method according to claim 17, wherein setting the delay value of the variable delay circuitries comprises setting a first delay value of one of the first and second variable delay circuits to a predetermined value and variably controlling a second delay value of the other of the first and second variable delay circuits.

20. The control method according to claim 17, further comprising:

maintaining the delay value of the variable delay circuitries during transmission of the reference signal and the phase modulation signal transmitted from the transmitter.

21. The control method according to claim 17, further comprising:

variably controlling a first delay value and a second delay value of the first and the second variable delay circuits, respectively, to decrease a phase difference between the reference signal and the adjustment signal.

22. A data transmission system comprising:

a transmitter for transmitting a reference signal and a phase modulation signal, the phase modulation signal having a phase difference with respect to the reference signal related to a value of input data, and for transmitting an adjustment signal having no phase difference with respect to the reference signal during an adjustment period before transmitting data;

a receiver for outputting an output data in accordance with the phase difference between the reference signal and the phase modulation signal;

variable delay means for delaying at least one of the reference signal, the phase modulation signal, and the adjustment signal transmitted from the transmitter; and control means for variably controlling a delay value of the variable delay means, so as to decrease the phase difference between the reference signal received at the receiver from the transmitter and the adjustment signal received at the receiver from the transmitter, wherein the variable delay means comprise a first variable delay circuit provided to a first transmission line between the transmitter and the receiver through which the reference signal is transmitted from the transmitter and a second variable delay circuit provided to a second transmission line between the transmitter and the receiver through which the phase modulation signal is transmitted from the transmitter, and the control means sets a first delay value of one of the first and second variable delay circuits to a predetermined value and variably controls a second delay value of the other of the first and second variable delay circuits.

23. The data transmission system according to claim 22, wherein the control means variably controls the first delay value and the second delay value of the first and the second variable delay circuits, respectively, to decrease a phase difference between the reference signal and the adjustment signal.

* * * * *

UNITED STATES PATENT AND TRADEMARK OFFICE
CERTIFICATE OF CORRECTION

PATENT NO. : 8,019,033 B2
APPLICATION NO. : 11/126190
DATED : September 13, 2011
INVENTOR(S) : Hiroshi Yamaguchi It is certified that error appears in the above-identified patent and that said Letters Patent is hereby corrected as shown below:

In the Specifications:

Column 2, Line 34: Delete "1A," and insert -- 11A, --, therefor

Column 2, Line 45: Delete "1C," and insert -- 11C, --, therefor

Column 7, Line 41: Delete "keeps" and insert -- 5 keeps --, therefor

Column 7, Line 49: Delete "DATA0" and insert -- DATA0. --, therefor

In the Claims:

Column 9, Line 51: In Claim 11, delete "variable," and insert -- variable --, therefor Signed and Sealed this
Fourteenth Day of May, 2013

Teresa Stanek Rea
*Acting Director of the United States Patent and Trademark Office*